United States Patent
Hirata et al.

(10) Patent No.: US 6,734,352 B2
(45) Date of Patent: May 11, 2004

(54) PHOTOELECTRIC CONVERSION DEVICE

(75) Inventors: Masahiro Hirata, Osaka (JP); Tsuyoshi Otani, Osaka (JP); Yuko Tawada, Settsu (JP)

(73) Assignees: Nippon Sheet Glass Company, Limited, Osaka (JP); Kaneka Corporation, Osaka (JP)

( * ) Notice: Subject to any disclaimer, the term of this patent is extended or adjusted under 35 U.S.C. 154(b) by 0 days.

(21) Appl. No.: 10/294,082

(22) Filed: Nov. 13, 2002

(65) Prior Publication Data

US 2003/0121544 A1 Jul. 3, 2003

Related U.S. Application Data

(63) Continuation of application No. 09/980,512, filed as application No. PCT/JP01/01604 on Mar. 2, 2001, now Pat. No. 6,512,170.

(30) Foreign Application Priority Data

Mar. 2, 2000 (JP) ........................... 2000-057771
Apr. 18, 2000 (JP) ........................... 2000-116688

(51) Int. Cl.[7] .......................... H01L 31/052; G02B 1/11
(52) U.S. Cl. ................... 136/256; 136/251; 136/261; 136/258; 136/244; 136/257; 136/255; 136/249; 257/432; 257/434; 257/433; 257/53; 257/437
(58) Field of Search ............... 136/256, 251, 136/261, 258, 244, 257, 255, 249; 257/432, 434, 433, 437, 53

(56) References Cited

U.S. PATENT DOCUMENTS

| | | | |
|---|---|---|---|
| 4,371,740 A | | 2/1983 | Clem |
| 4,994,879 A | | 2/1991 | Hayashi |
| 5,252,140 A | * | 10/1993 | Kobayashi et al. ......... 136/258 |
| 5,279,679 A | * | 1/1994 | Murakami et al. ......... 136/246 |
| 5,527,716 A | * | 6/1996 | Kusian et al. ............. 136/244 |
| 6,252,157 B1 | | 6/2001 | Nishio |
| 6,384,318 B1 | | 5/2002 | Nomura |
| 6,512,170 B1 | * | 1/2003 | Hirata et al. .............. 136/256 |

FOREIGN PATENT DOCUMENTS

| | | |
|---|---|---|
| EP | 1 058 320 A2 | 12/2000 |
| JP | 63-195149 | 8/1988 |
| JP | 2-177573 | 7/1990 |
| JP | 3-19374 | 1/1991 |
| JP | 5-221683 A | 8/1993 |
| JP | 11-274536 | 10/1999 |

OTHER PUBLICATIONS

Adurodija et al., "Higly conducting idium tin oxide (ITO) thin films deposited by pulsed laser ablation," Thin Solid Films, vol. 350, pp. 79–84, (1999).

* cited by examiner

Primary Examiner—Alan Diamond
(74) Attorney, Agent, or Firm—Merchant & Gould P.C.

(57) ABSTRACT

The present invention provides a photoelectric conversion device that improves photoelectric conversion efficiency with the interaction between a transparent substrate with a transparent conductive film, an antireflection film, and a photoelectric conversion unit. The antireflection film contains fine particles having an average particle diameter of 0.01 to 1.0 μm and has an uneven surface derived from the fine particles. The glass sheet with a transparent conductive film has a light transmittance of 75% or more in the wavelength region of 800 nm to 900 nm. The photoelectric conversion unit includes at least a photoelectric conversion unit including a photoelectric conversion layer having a band gap of 1.85 eV or less.

13 Claims, 8 Drawing Sheets

PHOTOELECTRIC CONVERSION DEVICE

"This application is a continuation of application Ser. No. 09/980,512, filed Oct. 31, 2001, now U.S. Pat. No. 6,512, 170, which is a 371 of PCT/JP01/01604, filed Mar. 2, 2001, which application(s) are incorporated herein by reference.

TECHNICAL FIELD

The present invention relates to a photoelectric conversion device. More specifically, the present invention relates to a photoelectric conversion device including a photoelectric conversion layer of semiconductor material that has a relatively small band gap and photosensitivity even in a longer wavelength region.

BACKGROUND ART

In a thin film-type photoelectric conversion device that uses a glass sheet as a substrate, a transparent conductive film, acting as a transparent electrode, is formed on the glass sheet, and a thin film photoelectric conversion unit including a photoelectric conversion layer is formed on the transparent conductive film. A tin oxide film often is employed as the transparent conductive film. The unevenness generated on the surface of the transparent conductive film with the growth of crystal grains has the effect of improving photoelectric conversion efficiency by trapping incident light in the photoelectric conversion layer or in the vicinity of the layer (i.e., light trapping effect). Thus, as for transparent conductive films, various surface shapes to improve the photoelectric conversion efficiency have been proposed.

Examples of the known thin film photoelectric conversion units are as follows: a unit including a photoelectric conversion layer formed of an amorphous silicon thin film, a unit including a photoelectric conversion layer formed of an amorphous silicon germanium thin film, and a unit including a photoelectric conversion layer formed of a crystalline silicon based thin film, such as microcrystalline silicon. Moreover, a tandem-type photoelectric conversion device has been under active development because of its ability to utilize light in a broad wavelength region. The tandem-type photoelectric conversion device includes two thin film photoelectric conversion units formed on a transparent conductive film, each unit having a different photoelectric conversion layer.

To increase the photoelectric conversion efficiency, a photoelectric conversion device requires some adaptation according to a photoelectric conversion layer to be used. For example, the thin film photoelectric conversion unit including the photoelectric conversion layer formed of a crystalline silicon based thin film (i.e., a crystalline silicon based thin film photoelectric conversion unit) has a smaller absorption coefficient than that of the amorphous silicon based unit. However, when the film thickness is increased simply to increase optical absorption, the manufacturing cost becomes higher. Therefore, the improvement in photoelectric conversion efficiency by taking advantage of the light trapping effect is important particularly to the photoelectric conversion device employing the crystalline silicon based thin film photoelectric conversion unit.

In general, the unit including the photoelectric conversion layer formed of an amorphous silicon germanium thin film or crystalline silicon based thin film has high sensitivity in the long wavelength region, compared with the unit including the photoelectric conversion layer formed of a general amorphous silicon thin film. Even with the amorphous silicon thin film, however, the spectral response becomes high in the long wavelength region as the film thickness increases. Therefore, when these thin films are used as a photoelectric conversion layer, it is necessary to pay considerable attention to the photoelectric conversion efficiency also in a relatively long wavelength region, e.g., at a wavelength of 650 nm or more.

However, a conventional photoelectric conversion device is not always provided with a structure suitable for the characteristics of its photoelectric conversion layer. For example, the photoelectric conversion device employing a crystalline silicon based thin film photoelectric conversion unit can have a large light trapping effect when the slope of concave and convex portions in the surface of a transparent conductive film is made sharp. However, this may degrade the quality of a crystalline silicon based thin film to be formed on the transparent conductive film. Even if the crystalline silicon based thin film is formed via other thin films, as in the tandem structure, the surface unevenness with a large degree of slope causes degradation in the crystallinity of the crystalline silicon. Thus, it is desired that the crystalline silicon based thin film-type photoelectric conversion unit should achieve the light trapping effect, which is important to improve the photoelectric conversion efficiency, without relying only on the surface unevenness of the transparent conductive film.

Even when using a photoelectric conversion layer that renders the photoelectric conversion efficiency in a relatively long wavelength region important, the conventional photoelectric conversion unit does not always adjust properly the characteristics of other members and thin films to be used with the photoelectric conversion layer, particularly their transmittance and contributions to the light trapping effect in that wavelength region.

DISCLOSURE OF INVENTION

Therefore, with the foregoing in mind, it is an object of the present invention to provide a photoelectric conversion device that includes a photoelectric conversion layer having high photoelectric conversion efficiency even in a relatively long wavelength region, i.e., a photoelectric conversion layer having a relatively small band gap, and that is provided with a structure capable of improving the photoelectric conversion efficiency of the photoelectric conversion layer. In particular, it is an object of the present invention to provide a photoelectric conversion device that improves the photoelectric conversion efficiency of a crystalline silicon based thin film photoelectric conversion unit without relying only on the light trapping effect obtained by a transparent conductive film.

To achieve the above objects, a photoelectric conversion device of the present invention includes the following: a transparent substrate having a first principal surface and a second principal surface that are parallel to each other; an antireflection film formed on the first principal surface; a transparent conductive film formed on the second principal surface; at least one photoelectric conversion unit formed on the transparent conductive film; and a back electrode formed on the photoelectric conversion unit. The antireflection film contains fine particles with a particle diameter in the range of 0.01 $\mu$m to 1.0 $\mu$m and has an uneven surface derived from the fine particles. The transparent substrate has a light transmittance of 75% or more in a wavelength region in the range of 800 nm to 900 nm when measured with the transparent conductive film formed thereon. At least one of the photoelectric conversion units includes a thin film of semiconductor material having a band gap of 1.85 eV or less as a photoelectric conversion layer.

It is preferable that the above photoelectric conversion device has photosensitivity even in a long wavelength region so that an external quantum efficiency at a wavelength of 700 nm is 0.2 or more. It is more preferable that the external quantum efficiency at the same wavelength is 0.3 or more. In the above photoelectric conversion device, when the thin film of semiconductor material is a crystalline silicon based thin film, it is preferable that the photoelectric conversion unit including the crystalline silicon based thin film as a photoelectric conversion layer has a thickness of 10 $\mu$m or less.

DETAILED DESCRIPTION OF THE INVENTION

Figure 1:
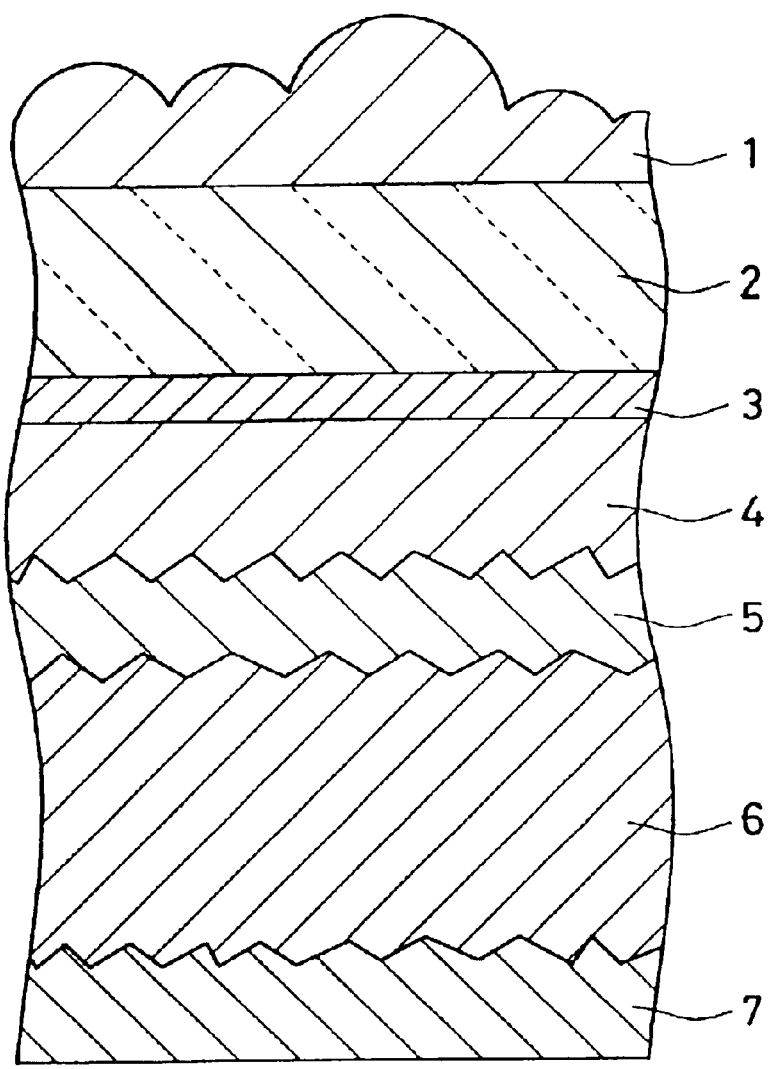
FIG. 1 is a cross-sectional view of an embodiment of a photoelectric conversion device of the present invention.

Hereinafter, the preferred embodiments of the present invention will be described.

A photoelectric conversion device of the present invention can use not only a crystalline silicon based thin film but also an amorphous silicon based thin film as a photoelectric conversion layer. Examples of the amorphous silicon based thin film include an amorphous silicon thin film, an amorphous silicon germanium thin film, and an amorphous silicon tin thin film. The amorphous silicon thin film generally has its peak sensitivity in the wavelength region of 500 to 600 nm, and thus it is not so sensitive to light in a long wavelength region. Therefore, when the amorphous silicon thin film is used as a photoelectric conversion layer, it is preferable that the external quantum efficiency at a wavelength of 700 nm is 0.2 or more. This can be achieved by increasing the film thickness or reducing the band gap with addition of germanium, tin, or the like. However, a tandem structure including a plurality of photoelectric conversion layers, which will be described later, can achieve the effects of the invention sufficiently without increasing the external quantum efficiency of the amorphous silicon thin film, as long as it can provide the external quantum efficiency substantially equal to that described above as a whole. The photoelectric conversion device of the present invention is suitable particularly for using a thin film of semiconductor material having a band gap of 1.75 eV or less as a photoelectric conversion layer.

The band gap of a crystalline silicon thin film is smaller than that of the amorphous silicon thin film, generally about 1.1 eV. When the crystalline silicon thin film is used as a photoelectric conversion layer, it is preferable that the thin film photoelectric conversion unit has a thickness of 10 $\mu$m or less, more preferably 5 $\mu$m or less, in order to prevent an excessive increase in the manufacturing cost. There is no particular limitation to the above thickness, and it is preferably 0.1 $\mu$m or more.

To improve the photoelectric conversion efficiency of a photoelectric conversion unit, the present invention allows an antireflection film containing fine particles to be formed on the light incident side of a transparent substrate. A thin film having an appropriate refractive index, which is calculated optically based on the refractive index of the substrate, often is used to suppress reflection from the transparent substrate. A typical antireflection film for a glass sheet is a magnesium fluoride thin film with a flat surface formed by vacuum evaporation or the like.

However, the present inventors have found out that an antireflection film whose surface is made uneven by fine particles is more suitable for the photoelectric conversion layer formed of material with a relatively small band gap, particularly for the photoelectric conversion layer formed of a crystalline silicon thin film with low absorption. In an embodiment of the present invention, the antireflection film contributes to the enhancement of the light trapping effect. In another embodiment of the present invention, the antireflection film has the effect of reducing reflection in a broad wavelength region, particularly in a long wavelength region, thereby improving the characteristics of a photoelectric conversion device.

When a thin film photoelectric conversion unit including the above photoelectric conversion layer is used with the antireflection film having an uneven surface, the transmittance of a transparent substrate on which a transparent conductive film is formed exerts a greater influence on the efficiency. Specifically, it is preferable that the transparent substrate with a transparent conductive film has a light transmittance of 75% or more in the wavelength region of 800 to 900 nm. Such high light transmittance in the above wavelength region combines the effects of reducing reflection and trapping light by the antireflection film, particularly the light trapping effect, with the improvement in photoelectric conversion efficiency.

The light trapping effect resulting from the surface shape of the antireflection film is produced in the area including the transparent substrate with a transparent conductive film (i.e., the area from the surface of the antireflection film to a back electrode) in a photoelectric conversion device. Therefore, the amount of light passing through the transparent substrate with a transparent conductive film is increased with the light trapping effect. Thus, the increased amount of light through the transparent substrate with a transparent conductive film reinforces the light trapping effect obtained by the antireflection film.

A combination of the above thin film photoelectric conversion unit, antireflection film, and glass sheet with a transparent conductive film can improve the photoelectric conversion efficiency rationally while preventing unnecessary increase in the manufacturing cost.

FIG. 1 is a cross-sectional view of a preferred embodiment of a photoelectric conversion device of the present invention. The photoelectric conversion device has a tandem structure, in which an antireflection film 1, a glass sheet 2, an underlying film 3, a transparent conductive film 4, an amorphous silicon based thin film photoelectric conversion unit 5, a crystalline silicon based thin film photoelectric conversion unit 6, and a back electrode 7 are stacked in this order from the light incident side. The antireflection film 1 of the photoelectric conversion device has an uneven surface derived from the shapes of fine particles.

It is preferable that the antireflection film 1 contains fine particles and a binder. As the fine particles, oxide fine particles are preferable, and fine particles made of material having a refractive index of 2.0 or less, particularly 1.6 or less, are preferable. The particularly suitable oxide fine particles are silica fine particles. Here, fine particles including silicon oxide as the main component are referred to as silica fine particles, even if they include other minor components. Examples of silica fine particles include the following: silica fine particles synthesized by the reaction of silicon alkoxide in the presence of a basic catalyst, such as ammonia, with a sol-gel process, colloidal silica of sodium silicate or the like, and fumed silica synthesized in a vapor phase.

As long as unevenness derived from fine particles is present at the surface of the antireflection film 1, it is not necessary to expose the fine particles directly on the surface. For example, a group of fine particles may be covered with a film-like coating of binder, as long as the film surface is made uneven by the shapes of the fine particles under the coating. However, the antireflection film having the exposed fine particles on the surface, as the film prepared in the example to be described later, has a remarkable effect of improving the photoelectric conversion efficiency.

In many cases, the antireflection film formed of fine particles has gaps between the fine particles. The inclusion of gaps reduces a substantial refractive index of the film and improves the antireflection effect. Actually, the structure of the antireflection film changes depending on the particle size of the fine particles. The gaps between particles decrease as the particle size of the fine particles is diminished. Consequently, capillary force is increased to allow moisture and organic matters in the air to enter the gaps gradually. When the gaps disappear, a refractive index of the film is increased. On the other hand, the adhesion to a glass sheet is lowered with increasing particle size of the fine particles. In view of this, it is preferable that the fine particles have an average particle diameter of 0.01 $\mu$m to 1.0 $\mu$m.

The particle size of the fine particles also can be used to adjust the optical characteristics of the antireflection film. The particle diameter suitable for the enhancement of antireflection effect is in the range of 0.05 $\mu$m to 0.15 $\mu$m. For example, when the surface of a glass sheet is coated with silica fine particles having a particle size within the above range, an antireflection effect is obtained that exceeds a magnesium fluoride film in a broad wavelength region, the magnesium fluoride film with an appropriate thickness being formed by vacuum evaporation.

Surprisingly, the fine particles with a particle diameter of 0.2 $\mu$m to 0.8 $\mu$m have been found to improve the light trapping effect significantly as well. For example, when a part of the surface of a glass sheet is coated with silica fine particles having a particle size within the above range, that alone leads to the improvement in the photoelectric conversion efficiency of a unit including a photoelectric conversion layer whose peak spectral response is shifted relatively to the long wavelength region, such as a crystalline silicon thin film. The fine particles described above may interact strongly with light in the wavelength region of 600 to 1000 nm and contribute largely to trapping light in the wavelength region where the spectral response of a crystalline silicon based photoelectric conversion layer or the like is high.

As described above, it is preferable that the fine particles have an average particle diameter of about 0.05 $\mu$m to 0.8 $\mu$m. Moreover, it is preferable that unevenness derived from the fine particles is formed in the area of at least 60% of the principal surface of a glass sheet. In particular, a large antireflection effect can be obtained when the fine particles having a particle diameter of 0.05 $\mu$m to 0.15 $\mu$m occupy at least 50% of the uneven area derived from the fine particles. Also, a large light trapping effect in the wavelength region where the spectral response of a crystalline silicon based photoelectric conversion layer is high can be obtained when the fine particles having a particle diameter of 0.2 $\mu$m to 0.8 $\mu$m occupy at least 30% of the uneven area derived from the fine particles. The presence of both fine particles together on the surface with the above percentage provides especially preferable results.

Here, the particle size of fine particles can be evaluated roughly with a scanning electron microscope. For precise measurements, a transmission electron microscope can be used. In the case where the fine particles are aggregated, the particle size of individual particles (primary particles) instead of aggregated particles (e.g., secondary particles linked in a chain form) is employed.

It is preferable that the antireflection film includes a binder as well as fine particles. The binder serves to bind the fine particles together and provide adhesion between the fine particles and a glass sheet. It is preferable that the binder is at least one metal oxide selected from the group consisting of silicon oxide, aluminum oxide, titanium oxide, zirconium oxide, and tantalum oxide. Considering film strength and chemical stability, it is preferable that the binder material is at least one alkoxide of metal selected from Si, Al, Ti, Zr, and Ta. For the film having a relatively large content of binder components, the refractive index of the binder components affects reflectance. Therefore, silicon alkoxide having a small refractive index, particularly silicon tetraalkoxide or its oligomer, is preferable.

The method for manufacturing an antireflection film containing silica fine particles and a binder is described in more detail below. The antireflection film can be formed with a coating solution that is prepared using silica fine particles and a metal compound such as metal alkoxide. The coating solution may be prepared by mixing a hydrolyzate of the metal compound and the silica fine particles. However, it is preferable that the coating solution is prepared by hydrolyzing a hydrolyzable metal compound in the presence of the silica fine particles. The hydrolysis of metal alkoxide in the presence of the silica fine particles accelerates a condensation reaction between a silanol group on the silica fine particle surface and the metal alkoxide in the coating solution. The condensation reaction enhances the adhesion between the silica fine particles. In addition, it reinforces the adhesion of the fine particles to a glass substrate by increasing reactivity of the silica fine particle surface. The coating solution thus prepared is applied to a glass sheet and then heated, resulting in an antireflection film formed on the glass sheet.

An antireflection film with a high area ratio of unevenness derived from silica fine particles can be formed in the following manner: the hydrolysis of a metal compound that acts as a binder is promoted in the presence of the silica fine particles or the content of binder is set to be within an appropriate range (e.g., the weight ratio of the binder is not more than that of the silica fine particles). There is no particular limitation to the amount of binder, as long as the antireflection film has an uneven surface derived from the shapes of the fine particles.

Next, the glass sheet 2 will be described. The glass sheet is not limited particularly by composition and thickness, as long as it has a light transmittance of 75% or more in the wavelength region of 800 to 900 nm with a transparent conductive film formed thereon. For the most typical soda-lime glass, the above light transmittance can be obtained easily when the glass has such a composition that the total amount of iron oxide, expressed by weight percentage in terms of $Fe_2O_3$, is 0.1% or less, preferably 0.08% or less. In forming an amorphous silicon based thin film photoelectric conversion unit, it is preferable that the glass sheet with a transparent conductive film has a light transmittance of 80% or more in the wavelength region of 500 to 600 nm.

When a float glass is used as the glass sheet, it is preferable that an antireflection film is formed on the bottom surface of the glass sheet (i.e., the surface in contact with the molten tin in a float bath). Since the bottom surface is superior to the opposite top surface in flatness, it is suitable for the application of a coating solution containing fine particles.

The following is an explanation for the underlying film 3 and the transparent conductive film 4.

As the transparent conductive film 4, an ITO film or zinc oxide film may be used. However, it is preferable to use a film including tin oxide as the main component, specifically a tin oxide film doped with impurities such as fluorine to increase conductivity. The thickness of the transparent conductive film can be determined properly by conductivity required in accordance with a photoelectric conversion unit to be used and its desired photoelectric conversion efficiency. Considering the necessity to set the light transmittance of the glass sheet with a transparent conductive film within the above range, a suitable thickness of the transparent conductive film ranges from about 400 nm to 1000 nm.

The surface unevenness of the transparent conductive film formed by the growth of crystal grains or the like further improves the light trapping effect. However, the formation of unevenness in the transparent conductive film surface is not essential in this embodiment. If the unevenness of this film is excessively sharp, the quality of a crystalline silicon based thin film may be degraded. Thus, it is preferable that the transparent conductive film has a haze ratio of 20% or less, particularly when a crystalline silicon based thin film is used.

The underlying film 3 is often provided to prevent the diffusion of alkaline component from a glass sheet and to adjust the optical characteristics of the glass sheet with a transparent conductive film. The underlying film is formed so that the glass sheet with a transparent conductive film has a light transmittance of 75% or more in the wavelength region of 800 to 900 nm with the underlying film interposed between the glass sheet and the transparent conductive film.

The underlying film may be composed of a single layer or plurality of layers. A preferred example of the underlying film is a film having a two-layer structure that includes a high refractive index film and a low refractive index film in this order from the glass sheet side. It is preferable that the high refractive index film is formed of at least one selected from tin oxide, titanium oxide, zinc oxide, tantalum oxide, niobium oxide, cerium oxide, zirconium oxide, silicon nitride, silicon oxynitride (SiON), and a mixture of these substances. It is preferable that this film has a thickness of 5 nm to 100 nm and a refractive index of 1.7 to 2.7.

It is preferable that the low refractive index film, having a refractive index relatively lower than that of the high refractive index film, is formed of at least one selected from silicon oxide, aluminum oxide, silicon oxide containing carbon (SiOC), and a mixture of these substances. It is preferable that this film has a thickness of 1 nm to 60 nm and a refractive index of 1.4 to 1.8.

There is no particular limitation on a method for forming the underlying film and the transparent conductive film, and a method that includes thermal decomposition of a material for producing a film on a glass sheet or glass ribbon in the glass sheet production line, particularly a CVD method, is preferable.

Next, a photoelectric conversion unit will be described. The photoelectric conversion unit preferably includes a plurality of layers, though a single layer may be used. The photoelectric conversion device in FIG. 1 has a so-called tandem structure, in which the unit including the photoelectric conversion layer formed of an amorphous silicon based thin film (i.e., an amorphous silicon based thin film photoelectric conversion unit) 5 and the unit including the photoelectric conversion layer formed of a crystalline silicon based thin film (i.e., a crystalline silicon based thin film photoelectric conversion unit) 6 are stacked in this order from the glass sheet side.

The photoelectric conversion device in FIG. 1 can achieve effective utilization of light in a broad wavelength region by using the photoelectric conversion layer formed of a crystalline silicon based thin film having a relatively small band gap (about 1.1 eV) with that formed of an amorphous silicon based thin film having a relatively large band gap. Here, the photoelectric conversion device of the present invention is not limited to the structure shown in FIG. 1. For example, crystalline silicon is used as a material with a small band gap ($\leq 1.85$ eV) in this structure. However, a semiconductor material having a band gap of 1.85 eV or less is not limited to the crystalline silicon.

In general, the amorphous silicon based thin film photoelectric conversion unit is formed by depositing each of the p-type, i-type, and n-type semiconductor layers in this order by plasma CVD. Specifically, e.g., the semiconductor layers may be deposited in the following order: a p-type microcrystalline silicon based layer doped with at least 0.01 at % boron that is an impurity atom for determining the conduction type, an intrinsic amorphous silicon layer that acts as a photoelectric conversion portion, and an n-type microcrystalline silicon based layer doped with at least 0.01 at % phosphorus that is an impurity atom for determining the conduction type. However, each of the semiconductor layers is not limited to that described above. For example, the impurity atom in the p-type microcrystalline silicon based layer may be aluminum or the like, and an amorphous silicon based layer may be used as the p-layer. In addition, the p-layer can be formed of alloy material such as amorphous or microcrystalline silicon carbide and silicon germanium. The suitable thickness of the amorphous silicon based thin film photoelectric conversion unit is 0.5 μm or less.

It is preferable that the conduction type (p-type and n-type) microcrystalline silicon based layers each have a thickness of 3 nm to 100 nm, more preferably 5 nm to 50 nm.

It is preferable that the intrinsic amorphous silicon layer is formed by plasma CVD with the temperature of an underlying layer maintained at 450° C. or less. This layer is formed as a substantially intrinsic semiconductor thin film that includes impurity atoms for determining the conduction type with a density of $1 \times 10^{18}$ cm$^{-3}$ or less. The generally preferred thickness of the intrinsic amorphous silicon layer, though it depends on the configuration of a photoelectric conversion device, ranges from 0.05 $\mu$m to 0.5 $\mu$m. However, the amorphous silicon based thin film photoelectric conversion unit can use a layer of alloy material instead of the intrinsic amorphous silicon layer. Examples of such a layer include an amorphous silicon carbide layer (e.g., the amorphous silicon carbide layer of amorphous silicon containing not more than 10 at % carbon) and an amorphous silicon germanium layer (e.g., the amorphous silicon germanium layer of amorphous silicon containing not more than 30 at % germanium).

When a crystalline silicon based thin film photoelectric conversion unit to be described below is not provided (i.e., the device is formed as a single cell), it is preferable that the intrinsic amorphous silicon layer whose thickness is increased to the extent that the external quantum efficiency at a wavelength of 700 nm is 0.2 or more is used as a photoelectric conversion layer. Alternatively, the photoelectric conversion layer may be formed of an amorphous silicon alloy based material to which germanium or the like is added so as to increase the external quantum efficiency to the above extent.

The crystalline silicon based thin film photoelectric conversion unit also is formed by depositing each of the pin-type semiconductor layers in this order by plasma CVD, following the same procedure as that for the amorphous silicon based thin film photoelectric conversion unit. For example, it is preferable that a crystalline silicon based photoelectric conversion layer, acting as the photoelectric conversion layer (i-layer) in the crystalline silicon based thin film photoelectric conversion unit, is formed by plasma CVD with the temperature of an underlying layer maintained at 450° C. or less.

As the crystalline silicon based photoelectric conversion layer, a non-doped intrinsic silicon polycrystalline thin film, a microcrystalline silicon thin film with a crystalline volume fraction of at least 80%, a weak p-type or n-type silicon based thin film containing a trace amount of impurities but having a sufficient photoelectric conversion function, or the like can be used. Moreover, layers of alloy material such as silicon carbide and silicon germanium may be used.

It is preferable that the crystalline silicon based photoelectric conversion layer has a thickness of 0.1 $\mu$m to 10 $\mu$m, more preferably 5 $\mu$m or less. The photoelectric conversion layer formed at low temperatures of 450° C. or less contains a relatively large amount of hydrogen atoms to terminate or deactivate defects in and between crystal grains. It is preferable that the hydrogen content in the layer ranges from 0.5 to 30 at %, more preferably 1 to 20 at %.

Most crystal grains in the crystalline silicon based photoelectric conversion layer grow in the thickness direction from an underlying layer to form columns. It is preferable that most crystal grains have (110) preferred orientation planes parallel to the film surface.

Compared with the amorphous silicon based thin film photoelectric conversion unit, the crystalline silicon based thin film photoelectric conversion unit generates a low open-circuit voltage and has a high short-circuit current density. Therefore, light transmittance contributes more to the photoelectric conversion efficiency than the sheet resistance of a conductive film on a glass sheet. Accordingly, providing the antireflection film having an uneven surface derived from fine particles and the glass sheet with a transparent conductive film having an improved light transmittance increases the amount of incident light and enables effective trapping of the incident light, which leads to a significant improvement in the photoelectric conversion efficiency.

The amorphous silicon photoelectric conversion layer has its maximum spectral response in the wavelength region of about 500 to 600 nm. On the other hand, the crystalline silicon photoelectric conversion layer has a maximum in the range of about 700 to 900 nm. Thus, the antireflection film containing fine particles with a particle diameter of 0.05 $\mu$m to 0.15 $\mu$m and those with a particle diameter of 0.2 $\mu$m to 0.8 $\mu$m, both fine particles being exposed on the surface, is suitable particularly for a tandem-type photoelectric conversion device including the above two photoelectric conversion layers.

Besides a polycrystalline substance, a "crystalline" material in this embodiment includes a material having a crystalline volume fraction of at least 50%, even if the material is locally amorphous. A "silicon based" material includes a semiconductor material containing at least 50 at % silicon, such as amorphous silicon germanium, in addition to amorphous or crystalline silicon.

The foregoing discussed an example of the photoelectric conversion device employing the silicon based thin film. However, the present invention can be applied to a photoelectric conversion device including a thin film of compound semiconductor (e.g., CdTe, CuIn(S, Se)$_2$, and Cu(In, Ga)(S, Se)$_2$) as the photoelectric conversion layer.

Examples

Hereinafter, the present invention will be described more specifically by way of example, but is not limited thereto.
Manufacture of Glass Sheet with Transparent Conductive Film Sample 1

In a production line for float glass, a tin oxide film (SnO$_2$ film), a silicon oxide film (SiO$_2$ film), and a fluorine-containing tin oxide film (SnO$_2$:F film) were formed in this order on a glass ribbon using a plurality of coaters arranged in a float bath. The glass ribbon is formed to have a thickness of 4 mm and the total amount of iron oxide of 0.01 wt % in terms of Fe$_2$O$_3$.

Specifically, the glass ribbon had a temperature of about 650° C. immediately before reaching a coater located at the furthest upstream position, and a mixed gas of dimethyltin dichloride (vapor), oxygen and nitrogen was supplied from the coater, so that a SnO$_2$ film having a thickness of 25 nm was formed on the glass ribbon. Then, a mixed gas of monosilane, ethylene, oxygen and nitrogen was supplied from a coater located downstream from said coater, and a $SiO_2$ film having a thickness of 25 nm was formed on the $SnO_2$ film. Then, a mixed gas of dimethyltin dichloride (vapor), oxygen, nitrogen and hydrogen fluoride (vapor) was supplied from a coater located further downstream from said coater, and a $SnO_2$:F film having a thickness of 500 nm was formed on the $SiO_2$ film. The glass ribbon was cut into a predetermined size, resulting in a glass sheet with a transparent conductive film (hereinafter, referred to as "Sample 1").

Sample 2

Using a continuous atmospheric-type CVD apparatus, a $SiO_2$ film and a $SnO_2$:F film were formed in this order on a borosilicate glass sheet having a thickness of 0.7 mm.

Specifically, the glass sheet that was cut into a predetermined size beforehand was heated to about 600° C., and a mixed gas of monosilane, oxygen and nitrogen was supplied to the surface of the glass sheet to form a $SiO_2$ film having a thickness of 25 nm. Then, a mixed gas of monobutyltin trichloride (vapor), oxygen, water vapor, nitrogen and trifluoroacetic acid (vapor) was supplied, and a $SnO_2$:F film having a thickness of 600 nm was formed on the $SiO_2$ film. Thus, a glass sheet with a transparent conductive film (hereinafter, referred to as "Sample 2") was obtained.

Sample 3

A glass sheet with a transparent conductive film (hereinafter, referred to as "Sample 3") was obtained in the same manner as that for Sample 1, except that the total amount of iron oxide in the glass ribbon was 0.11 wt % in terms of $Fe_2O_3$ and the thickness of the $SnO_2$:F film was 800 nm.

After washing and drying each of Samples 1 to 3, the spectral transmission characteristics in the wavelength region of 400 to 1000 nm were measured with an integrating-sphere photometer. Table 1 shows an average transmittance in the wavelength regions of 500 to 600 nm and 800 to 900 nm, together with a sheet resistance of the film surface.

TABLE 1

|  | Sample 1 | Sample 2 | Sample 3 |
|---|---|---|---|
| Transmittance (%) |  |  |  |
| 500–600 nm | 87 | 86 | 80 |
| 800–900 nm | 80 | 85 | 70 |
| Sheet resistance (Ω/□) | 19 | 11 | 8 |
| $SnO_2$:F thickness (nm) | 500 | 600 | 800 |

Formation of Antireflection Film

Samples 4 to 11

The glass sheet with a transparent conductive film obtained in the above was washed, dried, and then an antireflection film was formed on the opposite surface of the glass sheet to the transparent conductive film.

Specifically, to a dispersion of silica fine particles having a predetermined average primary particle size (manufactured by Nippon Shokubai Co., Ltd.) was added ethanol, tetraethoxysilane, and concentrated hydrochloric acid successively while stirring the dispersion, which then was stirred further to cause a reaction. The mixture was diluted with hexylene glycol to give a coating solution. The coating solution was applied to the surface of the glass sheet by spin coating, and the glass sheet was placed in an electric furnace at 700° C. for 2 minutes to form an antireflection film.

Depending on samples, the silica fine particle dispersions with different average particle sizes were mixed at a predetermined ratio of the solid matter.

Sample 12

Similarly, the glass sheet with a transparent conductive film obtained in the above was washed, dried, and then a magnesium fluoride film having a thickness of 100 nm was formed on the opposite surface of the glass sheet to the transparent conductive film by EB evaporation, which results in an antireflection film. Here, the film deposition temperature was set to a room temperature and the film deposition rate was 1 nm/sec.

The surfaces of the antireflection films of Samples 4 to 11 were observed with a scanning electron microscope to measure the ratio of the area of the glass surface coated with silica fine particles (i.e., a coating ratio). When those samples included silica fine particles having different average particle sizes, further measurement was made to determine the ratio of the area occupied by each of the fine particles to the area coated with the fine particles. Table 2 shows the results.

TABLE 2

|  | Sample 4 | Sample 5 | Sample 6 | Sample 7 | Sample 8 | Sample 9 | Sample 10 | Sample 11 | Sample 12 |
|---|---|---|---|---|---|---|---|---|---|
| Glass sheet with transparent conductive film | Sample 2 | Sample 2 | Sample 2 | Sample 2 | Sample 1 | Sample 3 | Sample 1 | Sample 2 | Sample 2 |
| Fine particle coating ratio (%) | 95 | 72 | 61 | 98 | 95 | 95 | 67 | 45 | ($MgF_2$ film) |
| Fine particles A |  |  |  |  |  |  |  |  |  |
| Average particle diameter (μm) | 0.1 | 0.1 | 0.1 | 0.07 | 0.1 | 0.1 | 0.25 | — | — |
| Occupancy (%) | 100 | 52 | 61 | 100 | 100 | 100 | 58 | — | — |
| Fine particles B |  |  |  |  |  |  |  |  |  |
| Average particle diameter (μm) | — | 0.3 | 0.5 | — | — | — | 0.9 | 0.5 | — |
| Occupancy (%) | — | 48 | 39 | — | — | — | 42 | 100 | — |

Figure 2:
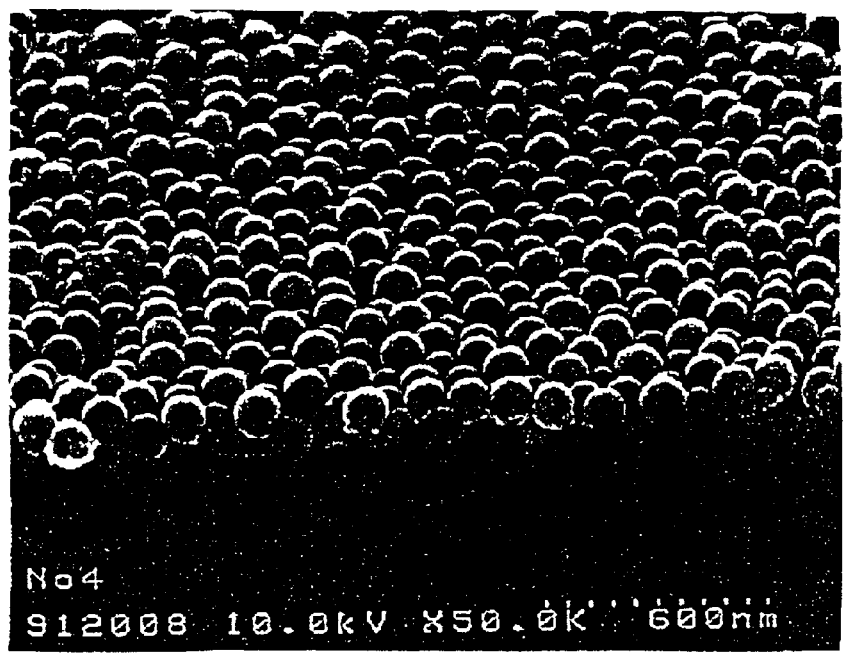
FIG. 2 shows the results of scanning electron microscope observation of the surface of a glass sheet on which an example of an antireflection film is formed.
Figure 3:
FIG. 3 shows the results of scanning electron microscope observation of the surface of a glass sheet on which another example of an antireflection film is formed.
Figure 4:
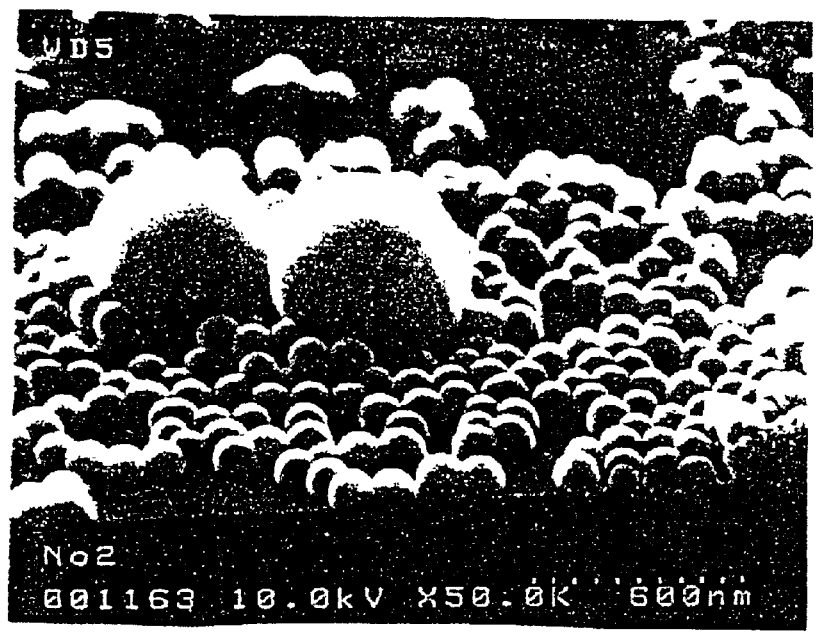
FIG. 4 shows the results of scanning electron microscope observation of the surface of a glass sheet on which yet another example of an antireflection film is formed.

FIGS. 2 to 4 show the results of scanning electron microscope observation of Samples 4 to 6, respectively. These results indicated that the fine particles to form the respective antireflection films were substantially spherical in shape and the variation in particle diameter was rather small. In each sample, substantially all the fine particles A have a particle diameter of 0.05 to 0.15 μm and substantially all the fine particles B have a particle diameter of 0.2 to 0.8 μm.

Formation of Photoelectric Conversion Unit and Back Electrode (Tandem Type)

Samples 13 to 24

Using the glass sheet with a transparent conductive film having an antireflection film (Samples 4 to 12) and the glass sheet with a transparent conductive film having no antireflection film (Samples 1 and 2), an amorphous silicon thin film photoelectric conversion unit and a crystalline silicon thin film photoelectric conversion unit were formed in this order on the transparent conductive film by plasma CVD. The amorphous silicon photoelectric conversion unit included a pin junction where a p-type amorphous silicon carbide layer had a thickness of 15 nm and an n-type amorphous silicon layer had a thickness of 30 nm. An intrinsic amorphous silicon layer was formed by RF plasma CVD. The film deposition conditions were such that silane (SiH$_4$) was used as a reaction gas, a pressure in the reaction chamber was about 40 Pa, an RF power density was 15 mW/cm$^2$, and a film deposition temperature was 150° C. An intrinsic amorphous silicon film, which was deposited directly on the glass substrate to have a thickness of 300 nm under the same conditions as those described above, had a dark conductivity of $5 \times 10^{-10}$ S/cm. The intrinsic amorphous silicon layer had a thickness of 150 nm. In addition, the intrinsic amorphous silicon layer prepared in the same manner as that described above had a band gap of about 1.75 eV.

The crystalline silicon thin film photoelectric conversion unit was prepared by depositing a boron-doped p-type microcrystalline silicon based layer, a non-doped intrinsic crystalline silicon layer, and a phosphorus-doped n-type microcrystalline silicon based layer in this order on the n-type amorphous silicon layer. The crystalline silicon thin film photoelectric conversion unit had a thickness of 1.5 μm. The thickness of the p-type microcrystalline silicon based layer was 15 nm and that of the n-type microcrystalline silicon based layer was 30 nm. The intrinsic crystalline silicon layer prepared in the same manner as that described above had a band gap of about 1.1 eV.

The intrinsic crystalline silicon layer was formed by plasma CVD under the condition that silane was used as a reaction gas, a pressure in the reaction chamber was about 670 Pa, an RF power density was 150 mW/cm$^2$, and a film deposition temperature was 350° C. The measurement with a secondary ion mass spectrometry showed that the intrinsic crystalline silicon layer contained 2 at % hydrogen. As a result of the peak intensity ratio based on an X-ray diffraction method, it was confirmed that the crystal grains in this layer had (110) planes as preferred orientation planes in the direction parallel to the film surface.

Moreover, a back electrode was formed by depositing an ITO layer (with a thickness of 80 nm) and a silver layer (with a thickness of 300 nm) in this order by sputtering, thus providing a photoelectric conversion device. The wavelength dependence of external quantum efficiency in each photoelectric conversion device was measured. The resultant efficiency for each wavelength was multiplied by the amount of incident light to give an external quantum efficiency, which then was integrated over the entire wavelength, so that the total current was calculated. Table 3 shows the results.

TABLE 3

|  | Sample 13 | Sample 14 | Sample 15 | Sample 16 |
|---|---|---|---|---|
| Glass sheet with transparent conductive film | Sample 2 | Sample 2 | Sample 2 | Sample 2 |
| Glass sheet with transparent conductive film and antireflection film | Sample 4 | Sample 5 | Sample 6 | Sample 7 |
| Total current (mA/cm$^2$) | 21.1 | 21.9 | 20.9 | 20.7 |
|  | Sample 17 | Sample 18 | Sample 19 | Sample 20 |
| Glass sheet with transparent conductive film | Sample 1 | Sample 3 | Sample 1 | Sample 2 |
| Glass sheet with transparent conductive film and antireflection film | Sample 8 | Sample 9 | Sample 10 | Sample 11 |
| Total current (mA/cm$^2$) | 19.8 | 17.2 | 18.1 | 20.4 |
|  | Sample 21 | Sample 22 | Sample 23 |  |
| Glass sheet with transparent conductive film | Sample 2 | Sample 2 | Sample 1 |  |
| Glass sheet with transparent conductive film and antireflection film | Sample 12 (MgF$_2$ film) | — | — |  |
| Total current (mA/cm$^2$) | 20.3 | 20.0 | 17.8 |  |

As shown in Table 3, Samples 13 to 16 and 20 had more favorable characteristics than Samples 22 and 21. Each of Samples 13 to 16 and 20 used Sample 2 on which an antireflection film was formed with fine particles exposed on the film surface, while Sample 22 used Sample 2 without forming the antireflection film and Sample 21 used Sample 2 on which a magnesium fluoride film was formed. Samples 17 and 19, each using Sample 1 on which an antireflection film was formed with fine particles exposed on the film surface, also had more favorable characteristics than Sample 23, using Sample 1 without forming the antireflection film. On the other hand, Sample 18, which included the glass sheet with a transparent conductive film of low transmittance, was degraded significantly in its characteristics.

Figure 5:
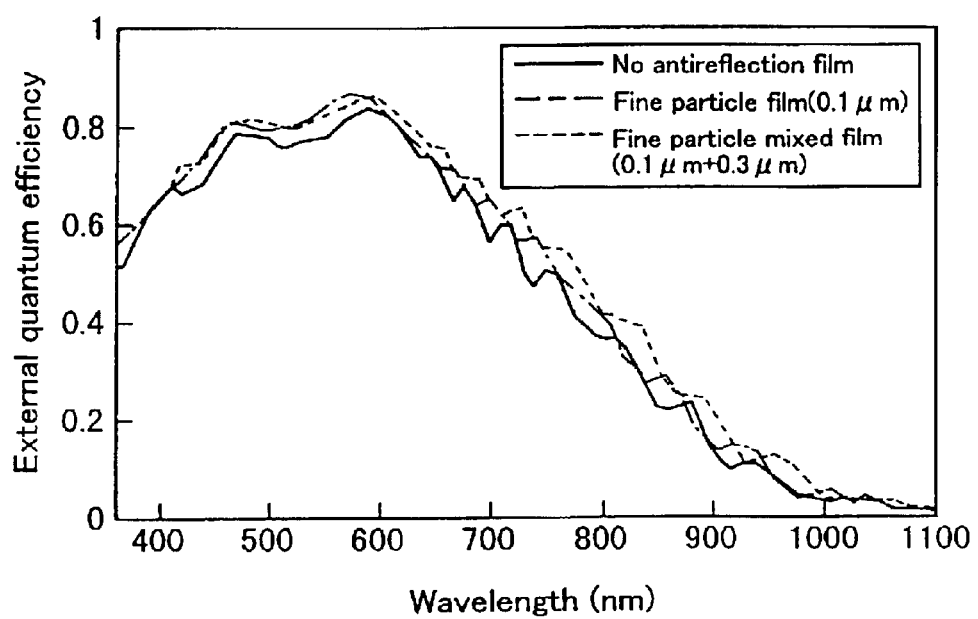
FIG. 5 shows an example of the wavelength dependence of external quantum efficiency of a photoelectric conversion device (tandem-type) of the present invention, including the case where the device has no antireflection film.

FIG. 5 shows the wavelength dependence of external quantum efficiency of Sample 13 (fine particle film), Sample 14 (fine particle mixed film) and Sample 22 (without an antireflection film), respectively. For the samples having the antireflection films formed of fine particles, the external quantum efficiency was increased in a broad wavelength region. In particular, using Sample 14 (fine particle mixed film) with the addition of fine particles B improved the external quantum efficiency in the wavelength region of 800 to 900 nm.

Sample 21, using magnesium fluoride as the antireflection film, had increased external quantum efficiency in the wavelength region near 500 to 600 nm. However, the degree of increase is small compared with the antireflection film containing fine particles, and the external quantum efficiency was hardly increased in the wavelength region near 800 to 900 nm.

Figure 6:
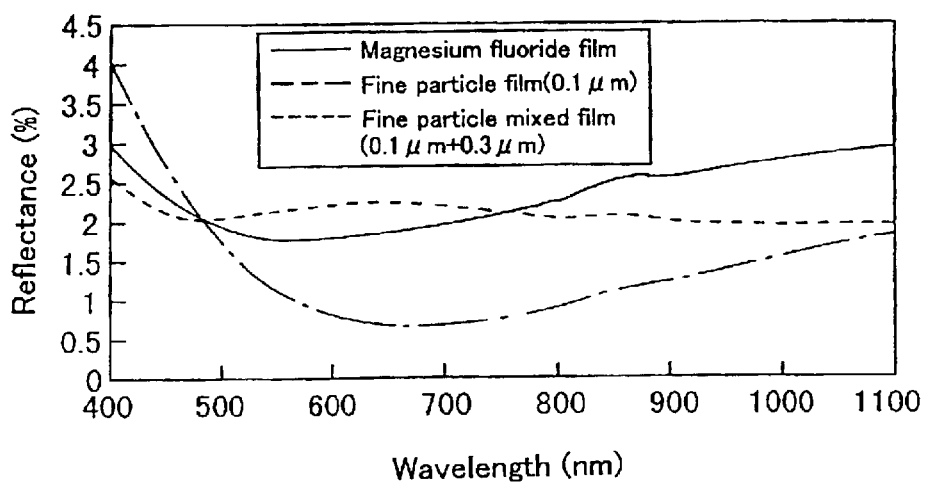
FIG. 6 shows the spectral reflection characteristics of a glass sheet with an antireflection film.

To investigate the reason for this, samples were prepared in such a manner that the same film as the antireflection film used in Samples 13, 14, and 21 was formed on a borosilicate glass sheet having a thickness of 0.7 mm. In each of the samples, the opposite surface of the glass sheet to the film was ground with a grindstone to be in a frosted glass form, which then was coated with a black paint to remove the luster. Consequently, reflection from this surface was suppressed to the extent that it was substantially negligible. The spectral reflection characteristics of the antireflection film surface of each sample were measured. FIG. 6 shows the results.

As shown in FIG. 6, the fine particle film with an average particle diameter of 0.1 μm was superior to the magnesium fluoride film in antireflection effect in a broad wavelength region. The fine particle mixed film, in which the fine particles having an average particle diameter of 0.1 μm were mixed with those having an average particle diameter of 0.3 μm, was inferior to the fine particle film in antireflection effect. However, the use of the fine particle mixed film improved the external quantum efficiency in the wavelength region near 800 to 900 nm, as shown in FIG. 5. Such improvement in the efficiency was due to the light trapping effect in that wavelength region.

Formation of Photoelectric Conversion Unit and Back Electrode (Only an Amorphous Silicon Based Unit)

Instead of the above tandem-type unit, a photoelectric conversion device was prepared, including an amorphous silicon based thin film photoelectric conversion unit having the photoelectric conversion layer formed of an amorphous silicon layer with an increased thickness or amorphous silicon germanium layer. Here, Sample 4, 5, or 2 was used as the glass sheet with a transparent conductive film so as to correspond to the samples whose external quantum efficiencies were shown in FIG. 5 (i.e., Sample 13 (fine particle film), Sample 14 (fine particle mixed film), and Sample 22 (without an antireflection film)).

The photoelectric conversion unit including an amorphous silicon layer as the photoelectric conversion layer was prepared in the same manner as that for the amorphous silicon photoelectric conversion unit in a tandem type. However, the thickness of an intrinsic amorphous silicon layer was 320 nm. The intrinsic amorphous silicon layer prepared in the same manner as that described above had a band gap of 1.75 eV.

In the photoelectric conversion unit including an amorphous silicon germanium layer as the photoelectric conversion layer, p-type and n-type layers were formed in the same manner as that for the amorphous silicon photoelectric conversion unit in a tandem type. However, the photoelectric conversion layer was formed by RF plasma CVD under the condition that $SiH_4$ and $GeH_4$ were used as a reaction gas, a pressure in the reaction chamber was about 40 Pa, an RF power density was 15 $mW/cm^2$, and a film deposition temperature was 150° C. The ratio of $GeH_4$ to the entire film deposition gas was about 5 mol %. The thickness of an intrinsic silicon germanium layer was 200 nm. The intrinsic silicon germanium layer prepared in the same manner as that described above had a band gap of 1.55 eV.

Moreover, a back electrode was formed on each of the photoelectric conversion units in the same manner as that described above to complete a photoelectric conversion device. The wavelength dependence of external quantum efficiency of each photoelectric conversion device was measured in the same manner as that described above.

Figure 7:
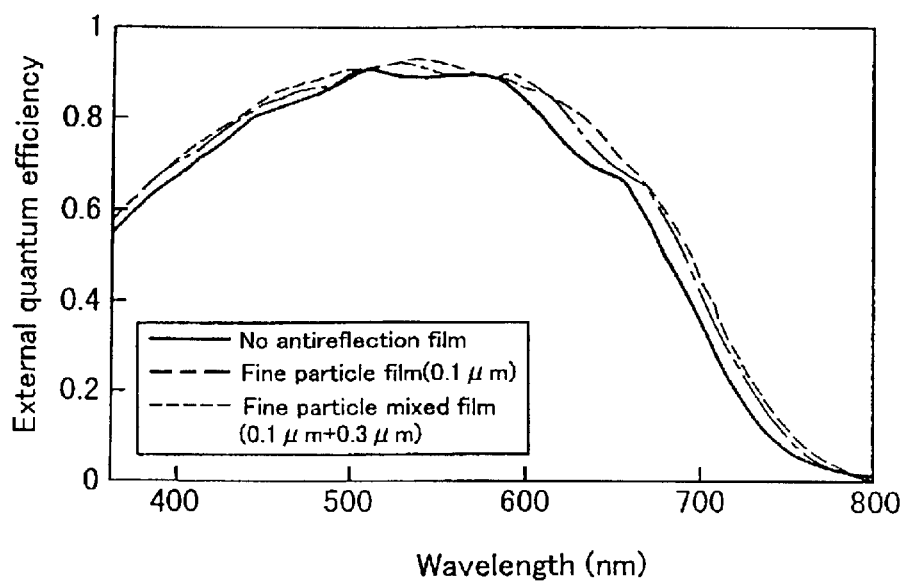
FIG. 7 shows an example of the wavelength dependence of external quantum efficiency of a photoelectric conversion device (having the photoelectric conversion layer formed of an amorphous silicon layer with an increased thickness) of the present invention, including the case where the device has no antireflection film.
Figure 8:
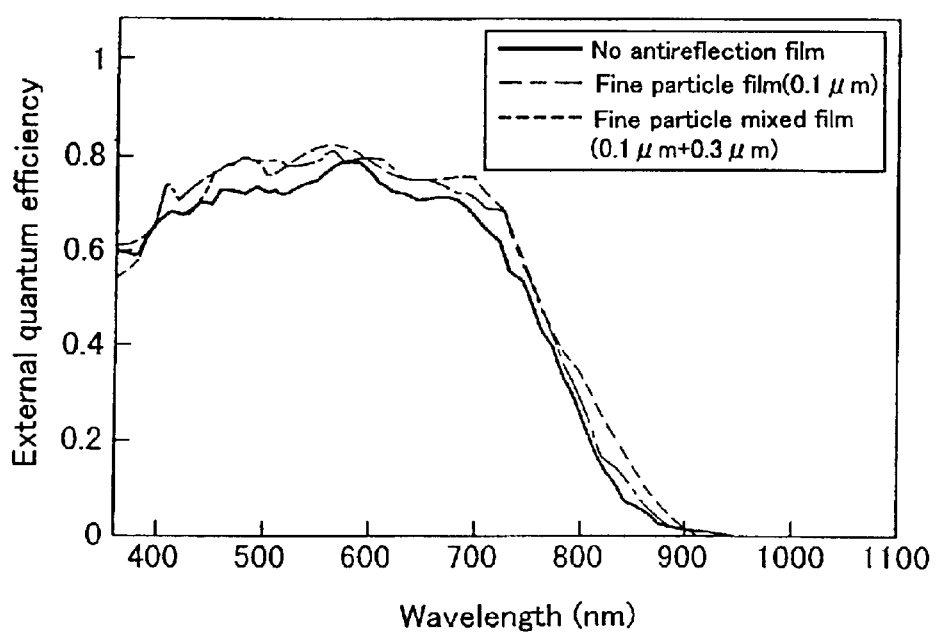
FIG. 8 shows an example of the wavelength dependence of external quantum efficiency of a photoelectric conversion device (having the photoelectric conversion layer formed of an amorphous silicon germanium layer) of the present invention, including the case where the device has no antireflection film.

FIG. 7 shows the wavelength dependence of external quantum efficiency in using the photoelectric conversion unit having the photoelectric conversion layer formed of an amorphous silicon layer with an increased thickness. FIG. 8 shows the wavelength dependence of external quantum efficiency in using the photoelectric conversion unit having the photoelectric conversion layer formed of an amorphous silicon germanium layer. As shown in FIG. 7, even if an intrinsic amorphous silicon thin film was used as the photoelectric conversion layer, the sufficient effect of improving photoelectric conversion efficiency was able to be obtained by increasing the film thickness to provide high photosensitivity in a long wavelength region. In view of this, the intrinsic amorphous silicon thin film was formed to have a thickness of at least about 320 nm, though the degree of increase in the thickness depended on a manufacturing method or the like.

In either case shown in FIGS. 7 and 8, the external quantum efficiency was improved in a relatively broad wavelength region, including a long wavelength region, by the antireflection films containing fine particles. Such antireflection films were suitable for a photoelectric conversion device whose external quantum efficiency was 0.2 or more at a wavelength of 700 nm when including no antireflection film, particularly 0.3 or more.

As described in detail above, the present invention can provide a photoelectric conversion device that improves the photoelectric conversion efficiency with the interaction between a transparent substrate with a transparent conductive film, an antireflection film formed of fine particles, and a photoelectric conversion unit (in particular, a crystalline silicon based photoelectric conversion unit). The photoelectric conversion device of the present invention, in which the characteristics of each member are mutually adjusted properly, can achieve an extremely rational improvement in the photoelectric conversion efficiency without unnecessary increase in the manufacturing cost.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A photoelectric conversion device comprising:

a transparent substrate having a first principal surface and a second principal surface that are parallel to each other;

an antireflection film formed on the first principal surface;

a transparent conductive film formed on the second principal surface;

an underlying film formed between the transparent substrate and the transparent conductive film;

at least one photoelectric conversion unit formed on the transparent conductive film; and a back electrode formed on the photoelectric conversion unit, wherein the antireflection film contains fine particles with an average particle diameter in a range of 0.01 μm to 1.0 μm and has an uneven surface derived from the fine particles, the transparent substrate has a light transmittance of 75% or more in a wavelength region in a range of 800 nm to 900 nm when measured with the transparent conductive film formed thereon, at least one of the photoelectric conversion units includes a thin film of semiconductor material having a band gap of 1.85 eV or less as a photoelectric conversion layer, the at least one photoelectric conversion unit includes a first photoelectric conversion unit and a second photoelectric conversion unit, the first photoelectric conversion unit and the second photoelectric conversion unit being stacked in this order from a side of the transparent conductive film, and the first photoelectric conversion unit is an amorphous silicon based photoelectric conversion unit having an amorphous silicon based thin film as the photoelectric conversion layer, and the second photoelectric conversion unit is an amorphous silicon based photoelectric conversion unit having an amorphous silicon germanium thin film or an amorphous silicon tin thin film as the photoelectric conversion layer.

2. The photoelectric conversion device according to claim 1, wherein an external quantum efficiency at a wavelength of 700 nm is 0.2 or more.

3. The photoelectric conversion device according to claim 1, wherein unevenness derived from the fine particles is formed in an area of at least 60% of the first principle surface of the transparent substrate.

4. The photoelectric conversion device according to claim 1, wherein the fine particles are made of a material having a refractive index of 2.0 or less.

5. The photoelectric conversion device according to claim 1, wherein the fine particles have an average particle diameter in a range of 0.05 $\mu$m to 0.8 $\mu$m.

6. A photoelectric conversion device comprising:

a transparent substrate having a first principal surface and a second principal surface that are parallel to each other;

an antireflection film formed on the first principal surface;

a transparent conductive film formed on the second principal surface;

at least one photoelectric conversion unit formed on the transparent conductive film; and a back electrode formed on the photoelectric conversion unit, wherein the antireflection film contains fine particles with an average particle diameter in a range of 0.01 $\mu$m to 1.0 $\mu$m and has an uneven surface derived from the fine particles, the transparent substrate has a light transmittance of 75% or more in a wavelength region in a range of 800 nm to 900 nm when measured with the transparent conductive film formed thereon, at least one of the photoelectric conversion units includes a thin film of semiconductor material having a band gap of 1.85 eV or less as a photoelectric conversion layer, and the fine particles include a first particle group with a particle diameter in a range of 0.05 $\mu$m to 0.15 $\mu$m and a second particle group with a particle diameter in a range of 0.2 $\mu$m to 0.8 $\mu$m.

7. The photoelectric conversion device according to claim 6, wherein an external quantum efficiency at a wavelength of 700 run is 0.2 or more.

8. The photoelectric conversion device according to claim 6, wherein the thin film of semiconductor material is a crystalline silicon based thin film.

9. The photoelectric conversion device according to claim 6, wherein unevenness derived from the fine particles is formed in an are of at least 60% of the first principal surface of the transparent substrate.

10. The photoelectric conversion device according to claim 6, wherein the fine particles are made of a material having a refractive index of 2.0 or less.

11. The photoelectric conversion device according to claim 6, wherein the fine particles have an average particle diameter in a range of 0.05 $\mu$m to 0.8 $\mu$m.

12. The photoelectric conversion device according to claim 6, further comprising an underlying film formed between the transparent substrate and the transparent conductive film.

13. The photoelectric conversion device according to claim 1, wherein the underlying film is composed of at least two layers.

* * * * *